United States Patent
Yonezawa et al.

(10) Patent No.: US 7,510,901 B2
(45) Date of Patent: *Mar. 31, 2009

(54) CONVEYOR DEVICE AND FILM FORMATION APPARATUS FOR A FLEXIBLE SUBSTRATE

(75) Inventors: Masato Yonezawa, Kanagawa (JP); Naoto Kusumoto, Kanagawa (JP); Hisato Shinohara, Yamanashi (JP)

(73) Assignees: Semiconductor Energy Laboratory Co., Ltd., Atsugi, Kanagawa-Ken (JP); TDK Corporation, Chuo-ku, Tokyo (JP)

( * ) Notice: Subject to any disclaimer, the term of this patent is extended or adjusted under 35 U.S.C. 154(b) by 374 days.

This patent is subject to a terminal disclaimer.

(21) Appl. No.: 11/157,925

(22) Filed: Jun. 22, 2005

(65) Prior Publication Data

US 2005/0235914 A1 Oct. 27, 2005

Related U.S. Application Data

(63) Continuation of application No. 10/981,582, filed on Nov. 5, 2004, now Pat. No. 6,916,509, which is a continuation of application No. 09/777,280, filed on Feb. 5, 2001, now Pat. No. 6,827,787.

(30) Foreign Application Priority Data

Feb. 10, 2000 (JP) .............................. 2000-032591

(51) Int. Cl.
*H01L 21/00* (2006.01)

(52) U.S. Cl. .......................................... 438/62; 438/61

(58) Field of Classification Search ............. 438/57–72; 118/728
See application file for complete search history.

(56) References Cited

U.S. PATENT DOCUMENTS

| 4,410,558 | A | | 10/1983 | Izu et al. | |
|---|---|---|---|---|---|
| 4,519,339 | A | | 5/1985 | Izu et al. | |
| 5,224,441 | A | | 7/1993 | Felts et al. | |
| 5,266,116 | A | * | 11/1993 | Fujioka et al. | 118/718 |
| 5,314,539 | A | | 5/1994 | Brown et al. | |
| 5,462,602 | A | | 10/1995 | Misiano et al. | |
| 6,827,787 | B2 | | 12/2004 | Yonezawa et al. | |
| 6,849,306 | B2 | | 2/2005 | Fukuda et al. | |
| 6,916,509 | B2 | * | 7/2005 | Yonezawa et al. | 427/549 |
| 2003/0072891 | A1 | | 4/2003 | Murakami et al. | |

FOREIGN PATENT DOCUMENTS

| JP | 58-216475 | 12/1983 |
|---|---|---|
| JP | 59-034668 | 2/1984 |

* cited by examiner

*Primary Examiner*—Richard A. Booth
(74) *Attorney, Agent, or Firm*—Fish & Richardson P.C.

(57) ABSTRACT

With a conventional cylindrical can method, a region used as a film formation ground electrode is a portion of the cylindrical can, and an apparatus becomes larger in size in proportion to the surface area of the electrode. A conveyor device and a film formation apparatus having the conveyor device are provided, which have a unit for continuously conveying a flexible substrate from one end to the other end, and which are characterized in that a plurality of cylindrical rollers are provided between the one end and the other end along an arc with a radius R, the cylindrical rollers being arranged such that their center axes run parallel to each other, and that a mechanism for conveying the flexible substrate while the substrate is in contact with each of the plurality of cylindrical rollers is provided.

8 Claims, 10 Drawing Sheets

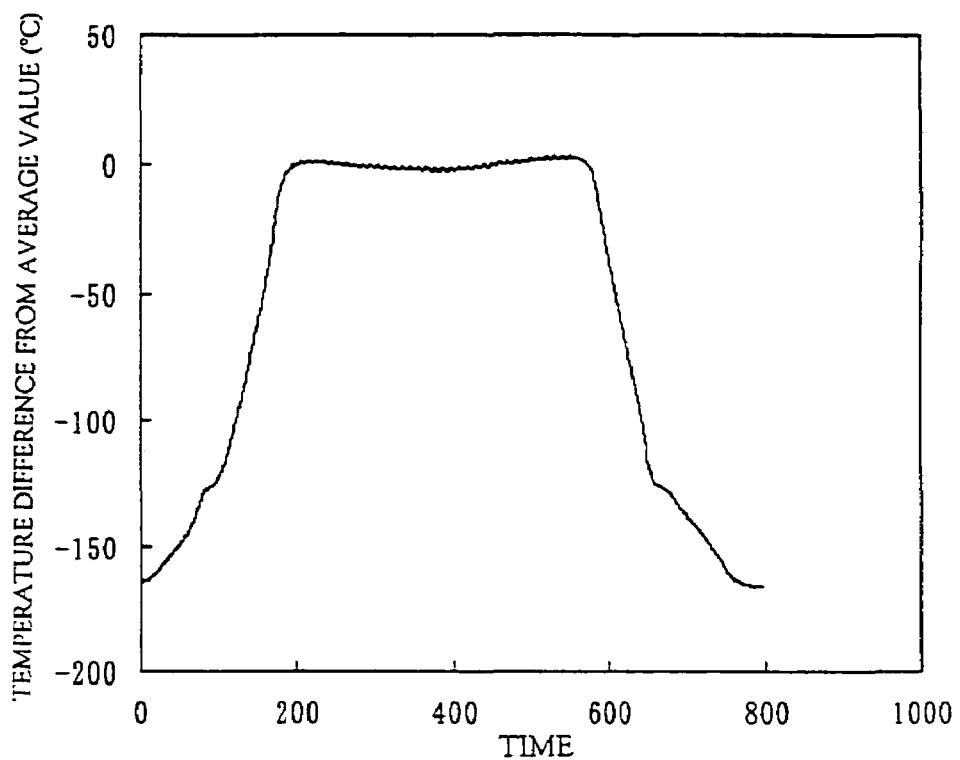
FIG. 9A  MEASUREMENT OF TEMPERATURE OF CURVED SURFACE ROLLER METHOD ELECTRODE
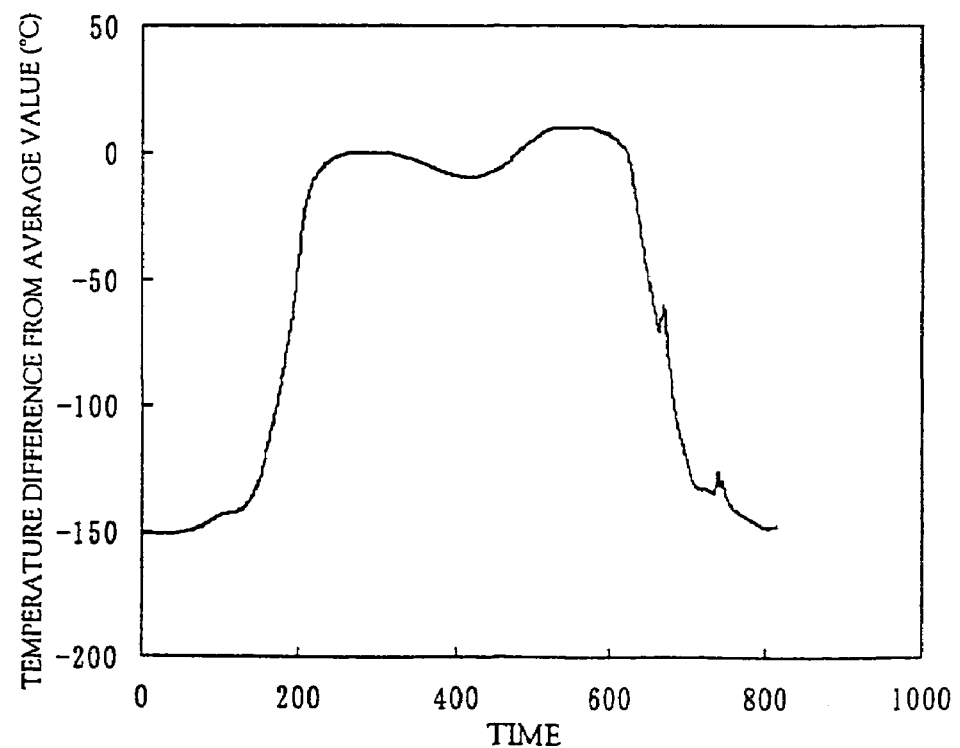
FIG. 9B  MEASUREMENT OF TEMPERATURE OF PARALLEL PLATE METHOD ELECTRODE

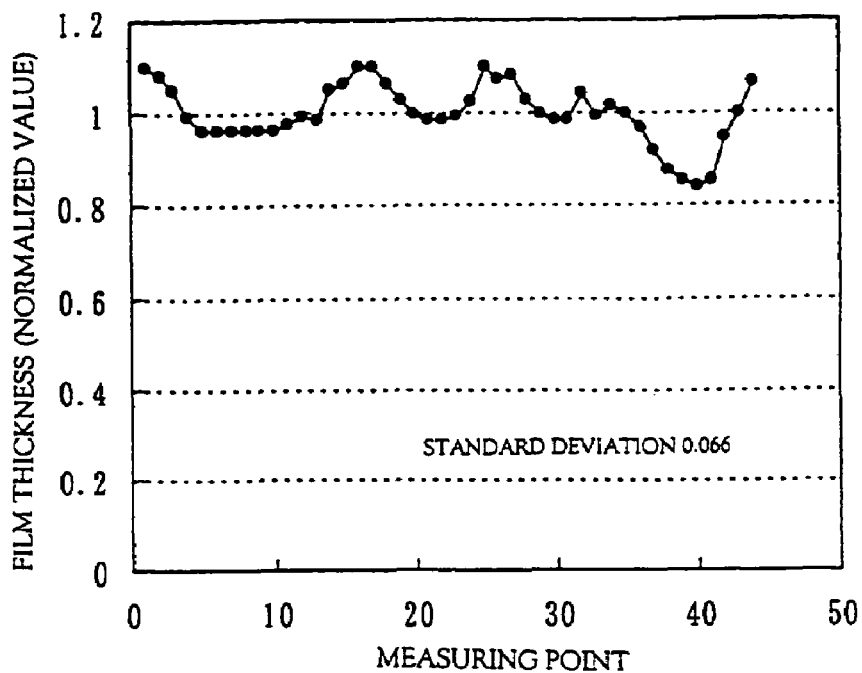
FIG. 10A  FILM FORMATION WITH PARALLEL PLATE METHOD ELECTRODE AND MEASUREMENT OF FILM THICKNESS IN SUBSTRATE WIDTH DIRECTION
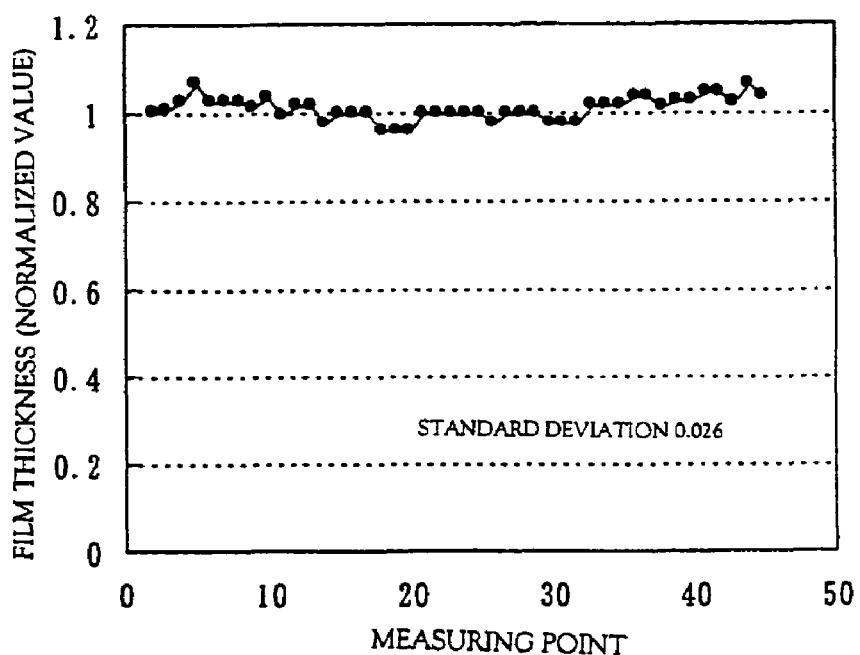
FIG. 10B  FILM FORMATION WITH CURVED SURFACE ROLLER METHOD ELECTRODE AND MEASUREMENT OF FILM THICKNESS IN SUBSTRATE WIDTH DIRECTION

CONVEYOR DEVICE AND FILM FORMATION APPARATUS FOR A FLEXIBLE SUBSTRATE

CROSS-REFERENCE TO RELATED APPLICATIONS

This application is a continuation application of U.S. application Ser. No. 10/981,582, filed Nov. 5, 2004, now U.S. Pat. No. 6,916,509, which is a continuation application of U.S. application Ser. No. 09/777,280, filed Feb. 5, 2001, now U.S. Pat. No. 6,827,787, which claims the benefit of a foreign priority application filed in Japan as Serial No. 2000-032591 on Feb. 10, 2000. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a conveyor device and film formation apparatus for a flexible substrate.

2. Description of the Related Art

Processes capable of manufacturing at low cost in the mass production of thin film solar batteries (solar cells) have been anticipated in recent years. A method for continuous processing, in which unit operations, such as film deposition, printing, and laser processing, are performed in-line while unwinding a rolled-up flexible substrate and winding it up onto another roll is known as one of measures for reducing production cost. This method is called a roll-to-roll method (hereafter referred to as roll-to-roll).

In particular, performing continuous conveying and continuous film formation using a film formation apparatus that is provided with a roll-to-roll type conveyor device such as that shown in, for example, Japanese Patent Laid-open No. Sho 58-216475 or Japanese Patent Laid-open No. Sho 59-34668, is effective as a means for increasing productivity of a thin film formation process.

Continuous film formation is performed while continuously conveying a flexible film substrate in a film formation apparatus having a roll-to-roll type conveyor device. In order to efficiently form a film to an objective thickness, one method is to lengthen a film formation electric discharge electrode and increase the conveyor speed.

However, when using a generally small size, low cost parallel plate method film formation apparatus for depositing a film to a flexible substrate while conveying the substrate by a conveyor device, wrinkles in the substrate become a cause of irregular film formation, which is a problem. A film formation apparatus in accordance with a parallel plate method is shown in FIGS. 1A and 1B. FIG. 1A is a side face of the entire film formation apparatus, and FIG. 1B is the vicinity, of an electrode 108 and a flexible substrate 101 as seen from below. The electrode 108 is grounded, and a heater is incorporated therein to heat the flexible substrate 101 as needed. Regarding a method of setting the substrate, first the flexible substrate is rolled out from a roll-out roll 105, the flexible substrate passes through gaps 103 formed in substrate conveying portion side faces of a roll-out vacuum chamber 110 and a film deposition vacuum chamber 102, the flexible substrate passes between the electrode 108 and an opposing electrode 109, passes through gaps 112 on the right side of the film formation vacuum chamber, and then, is rolled onto a roll-up roll 104. In order to maintain the substrate in parallel with the electrodes, a constant rotational torque is generated in the roll-up roll 104 and the roll-out roll 105, and a tensile force is applied to the substrate. The substrate is in a state of being suspended between guide rollers 106 and 107 at this time. Further, the flexible substrate stretches and shrinks, and therefore a lengthening force exists in the direction in which the substrate is being conveyed, and a contracting force exists in the width direction, in every portion of the flexible substrate suspended in the air and under application of the tensile force. This causes wrinkle 111 in the substrate. The expansion and shrinkage of the flexible substrate become large when heated by the heater, and wrinkle appears conspicuously. Furthermore, the film is formed with the portion that has been wrinkled exposed to an electric discharge, and this is therefore a cause of uneven film formation. The longer the electrode, namely the longer the portion of the substrate suspended in the air, the higher the frequency of wrinkle becomes.

One method for stopping the flexible substrate from wrinkling is a cylindrical can method. A film formation apparatus provided with a conveyor device in accordance with the cylindrical can method is shown, for example, in Japanese Patent Laid-open No. Sho 58-216475. By applying a tensile force to a flexible substrate, and bringing the substrate into close contact with a curved surface of a cylindrical can, which supports conveyance of the substrate, the wrinkles in the substrate can be suppressed. With a conventional cylindrical can method, a region used as a film formation grounding electrode is a portion of the cylindrical can, and the apparatus becomes larger in size in proportion to the surface area of the electrode. This increase in size is noticeable particularly in a multi-chamber type film formation apparatus in which a plurality of vacuum chambers are connected in a row in order to perform continuous film formation of PIN layers for forming a solar battery.

The increase in size cannot be avoided in a film deposition apparatus provided with a conveyor device of cylindrical can method, but in thinking about making the apparatus smaller, a method of using an improved parallel plate method can be considered. In this improved method, the portion contacting the flexible substrate and supporting the conveyance of the substrate may be made into a curved shape. A conveyor device using a curved surface electrode as a conveyance supporting portion, and a film formation apparatus provided with the conveyor device are shown in FIGS. 2A and 2B, respectively. A curved surface electrode 201 serves as both a conveyance supporting portion and an electric discharge grounding electrode. By applying a tensile force to a flexible substrate 204, the substrate is brought into close contact with the curved surface electrode, and wrinkles in the substrate can be suppressed. This method is remarkably superior to the cylindrical can method with respect to the point of making the apparatus smaller, and makes the apparatus a similar size comparable to that of the parallel plate method. However, a problem is that if the substrate is conveyed while a tensile force is applied thereto, the substrate, being in contact with the curved surface electrode during the conveyance, receives in its back surface abrasions due to rubbing between the back surface of the flexible substrate and the curved surface electrode. Another problem is that the longer the electrode becomes, the larger the friction force grows, which increases a force for winding up the substrate during conveyance and also increases a force working on the substrate to a considerable degree.

SUMMARY OF THE INVENTION

The present invention has been made in view of the above, and an object of the present invention is therefore to provide a film formation apparatus having a conveyor device of about the same size as a conventional parallel plate method conveyor device, which is more successful in reducing size than a film formation apparatus having a conventional cylindrical can method conveyor device, and which can continuously convey a flexible substrate while preventing, wrinkles in the flexible substrate and while preventing damage to the back surface of the flexible substrate.

The present invention is a conveyor device and a film forming apparatus with the conveyor device which comprise means for continuously conveying a flexible substrate from one end to the other end, characterized in that:

a plurality of cylindrical rollers are provided between the one end and the other end along an arc with a radius R, the cylindrical rollers being arranged such that their center axes run parallel to each other; and a mechanism for conveying the flexible substrate while the substrate is in contact with each of the plurality of cylindrical rollers is used. A tensile force is applied to the flexible substrate and it is placed in close contact with each of the plurality of cylindrical rollers. Wrinkles in the flexible substrate can thus be prevented, and it is possible to continuously convey the flexible substrate while preventing damage to the back surface of the substrate. FIG. 3 shows details. First, consider a curved surface 301 possessing an arc having a radius R (302) with a center axis 303 as the center. The curved surface 301 is shown for the explanation, and does not actually exist. Next, a plurality of cylindrical rollers 304 having an arbitrary length are lined up consecutively on the curved surface 301 so that gaps between the rollers become as small as possible. Each center axis 305 of the plurality of cylindrical rollers 304 is on the curved surface 301, and is parallel with the center axis 303 of the curved surface 301. In addition, a tensile force is applied to a flexible substrate 306, so that the substrate is brought into close contact with the plurality of cylindrical rollers. Care that the plurality of cylindrical rollers 304 are arranged such that a wrap angle at which the flexible substrate 306 contacts each cylindrical roller 304 is always kept positive. The conveyor device provided with means for continuously conveying the flexible substrate, and the film formation apparatus having the conveyor device according to the present invention, are referred to as a curved surface roller method. In the conveyor device and the film formation apparatus therewith, it is proper that the radius R (302) is in a range of 0.5-10 m.

A method of arranging the cylindrical rollers is stated and shown in FIGS 4A to 4C. As shown in FIG. 4A, a curved surface 401 on which the center axes of the cylindrical rollers is arranged is taken as one type, and cylindrical rollers 402 may be lined up on the curved surface at equal gaps. When necessary, the gaps may not be equal but varied. Alternatively, as shown in FIG. 4B, the cylindrical rollers may be lined on a plurality of curved surfaces, the curved surface 401 and a curved surface 403, having different curvatures. Further, the diameter of the cylindrical rollers 402 may be different from one another. Considered differently, as shown in FIG. 4C, when a flexible substrate 407 is brought into contact with each of the plurality of cylindrical rollers, provided that an arc angle of portions 404 at which the flexible substrate contacts each of the cylindrical rollers, namely a wrap angle 405, is positive, the wrap angle may be arbitrary. In order to stabilize a film formation state in the direction in which the substrate is being conveyed, it is convenient to make all of the wrap angles uniform, but when there are mechanical restrictions such as the entire conveyor device must be contained within a vacuum chamber, then the angles may be freely set. This means that a curvature 406 of the curved surface is not constant but varies.

A film formation electric discharge electrode of a conventional parallel plate method is shown in FIG. 5A, and a film formation electric discharge electrode that also serves as a conveyance supporting portion of the curved surface roller method conveyor device is shown in FIG. 5B. A state in which a tensile force is applied to a flexible substrate so that the flexible substrate is brought into close contact with a plurality of cylindrical rollers is shown. With an electrode 504 of a conventional parallel plate method even if a tensile force 501 applied to a flexible substrate 512 is large, only a component force 503 in a direction parallel to the electrode exists in a substrate surface 507 opposing the electrode, and a component force 502 in a perpendicular direction cannot be obtained. Only component force 509 and 510 exist in both ends of the parallel plate method electrode. The component force 505 also cannot be obtained for the case of the curved surface roller method provided that cylindrical rollers 511 are lined up on a straight line. However, provided that the flexible substrate 512 contacts each of the cylindrical rollers 511 with a wrap angle 508 which is positive, a component force 506 in a direction pressing the substrate against the electrode is generated. Note that tensile forces and the component forces are shown in FIG. 5B assuming that the flexible substrate and the cylindrical rollers are in point contact. Regarding the electrodes of the curved surface roller method, each cylindrical roller is in contact with the substrate at a wrap angle of a positive value, and therefore all of the cylindrical rollers can press against the flexible substrate. In other words, the flexible substrate can be placed in close contact with the film formation electric discharge electrode that also serves as the conveyance supporting portion or the conveyor device.

A film formation apparatus having a curved surface roller method conveyor device is shown in FIGS. 6A and 6B. By shortening a portion of a flexible substrate which is suspended in the air in the curved surface roller method by arranging the cylindrical rollers as close as possible, it becomes possible to obtain the same close contact effect for the flexible substrate as when on a continuous curved surface in the cylindrical can method, and wrinkles in the flexible substrate, along with film formation unevennesses at the time of film formation caused by wrinkles, can be prevented. Further, by rotating each cylindrical roller 602 when the flexible substrate is conveyed, damage to the back surface of the substrate due to rubbing between the substrate and the film formation electric discharge electrode can be suppressed.

Comparing a film formation apparatus having, a curved surface roller method conveyor device, and a film formation apparatus having a cylindrical can method conveyor device, it is shown in FIGS. 7A and 7B that the apparatus for the curved surface roller method is more successful in reducing its size. FIG. 7A is a film formation apparatus having a curved surface roller method conveyor device and using an electrode that also serves as a conveyance supporting portion, and FIG. 7B is a film formation apparatus having a cylindrical can method conveyor device and using a cylindrical can electrode 710 that also serves as a combination conveyance supporting portion. The conveyor device of FIG. 7A is of a curved surface roller method with a radius of curvature R of 1000 mm, and the conveyor device of FIG. 7B is a cylindrical can method with a radius R of 500 mm. The total electrode surface area for each apparatus is about the same size. With the cylindrical can method, the radius can be kept at half of the radius of curvature in the curved surface roller method, but the entire cylindrical can must be set within the apparatus, and therefore the apparatus is inevitable large. In practice, not only is the size difference in the side face diagram important, but also the difference in volume of a vacuum chamber in a vacuum apparatus is very important. As the vacuum chamber is increased in size, a vacuum chamber wall used has to be thicker and more solid. Therefore the apparatus becomes very heavy, and things such as building floor strength become problems. The vacuum apparatus using a cylindrical can radius R of 500 mm may weight as heavy as 2 tons. Further, accompanying the increase in size of the vacuum chamber, components such as a vacuum pump used in an evacuation system also become large and high cost. There are many advantages in reducing the size of a film formation apparatus in which the electrode surface area obtained is about the same size, particularly the vacuum apparatus.

A state of thermal conduction to a flexible substrate is shown in FIG. 8 for a case of a plurality of cylindrical rollers in a curved surface roller method also used to heat the substrate. Regarding transfer of heat from a heater block 803 with a heater body incorporated therein to a flexible substrate 807, there is heat transfer in a region 801 because of contacting a cylindrical roller 804, and there is heat transfer in a region 802 from radiation by the heater block 803 and the cylindrical roller 804. When the substrate is conveyed the substrate passes alternately through the regions 801 and 802. In order to prevent fluctuations in the substrate temperature, a gap 805 between the heater block and the roller, and a gap 806 between the heater block and the substrate, are preferably adjusted. Further, there may be differences in the temperature of the substrate during high vacuum and during gas injection, even with the same heater temperature setting, and a difference between a substrate temperature at a contact portion at the region 801 and a substrate temperature at the radiated portion in the region 802 also may vary depending on the conveyor speed, and therefore special attention is given at the time of measuring the substrate temperature and designing.

BRIEF DESCRIPTION OF THE DRAWINGS

FIGS. 9A and 9B are graphs showing results of substrate temperature measurements in a curved surface roller method film formation apparatus and a parallel plate method film formation apparatus, respectively; and FIGS. 10A and 10B are graphs showing results of substrate width direction film thickness measurements in a parallel plate method film formation apparatus and a curved surface roller method film formation apparatus, respectively.

DETAILED DESCRIPTION OF THE PREFERRED EMBODIMENTS

[Embodiment]

Figure 8:
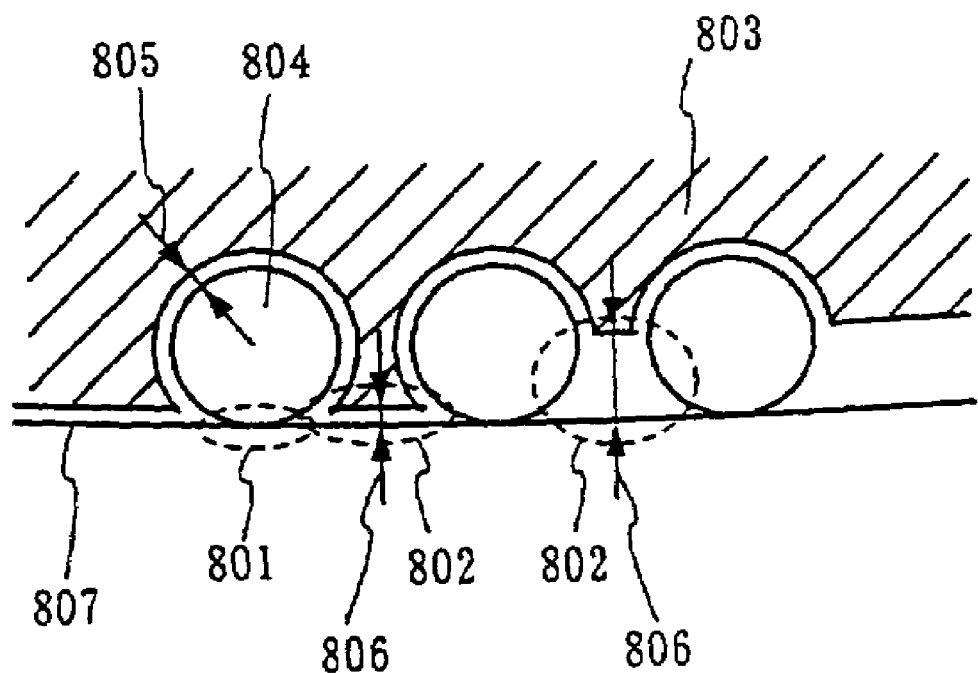
FIG. 8 illustrates thermal conduction in the curved surface roller method of the present invention.

An embodiment of the present invention is explained below. First, a conveyance supporting portion of a curved surface roller method conveyor device is manufactured. The conveyance supporting portion is composed of a curved surface block for transmitting heat from a heater uniformly, and a plurality of cylindrical rollers, which form a movable portion. An aluminum alloy having good thermal conductivity is used as a material thereof. The size of the curved surface block is 428 mm by 300 mm, and the maximum thickness is 30 mm. The radius of curvature R of the curved surface is set to 1000 mm. Next, 42 cylindrical rollers each having a diameter of 9 mm are attached through bearings across the curved surface. The angle between the cylindrical rollers is 0°35'. A gap 805 between the cylindrical rollers 804 and a heater block 803 shown in FIG. 8 is set to 1 mm. Further, a gap 806 between a flexible substrate 807 and the heater block is set to 7 mm.

Figure 1A:
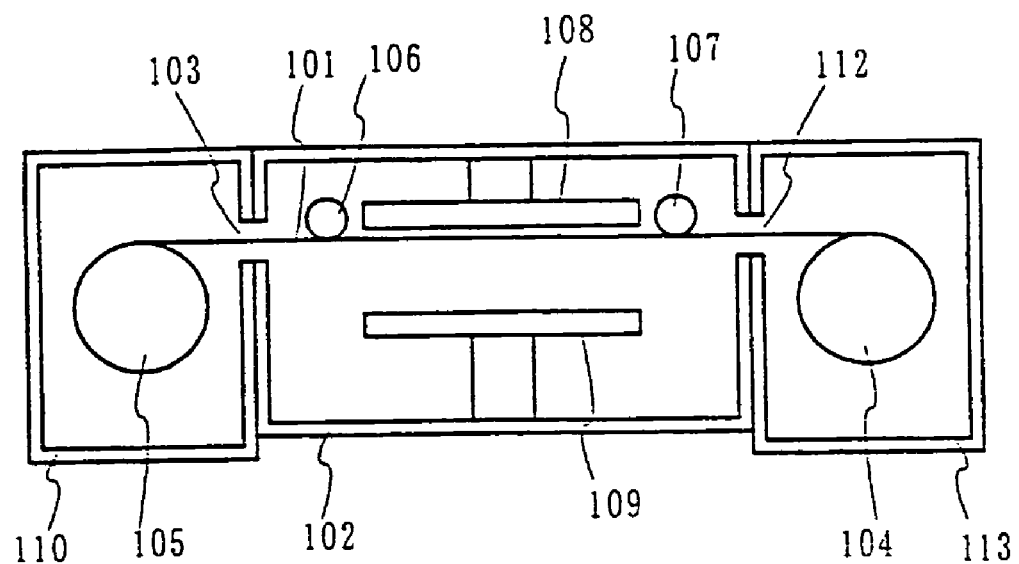
FIGS. 1A and 1B show flexible substrates in a conventional parallel plate method film formation apparatus.
Figure 1B:
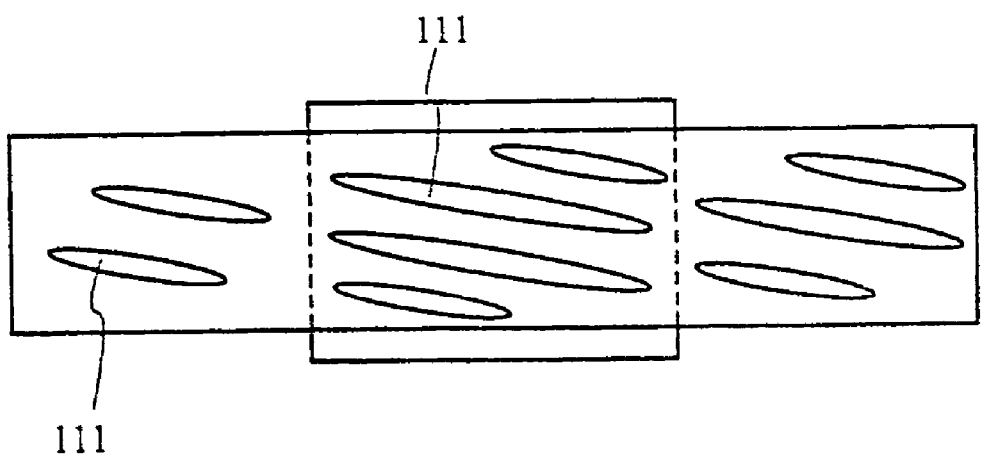
Figure 2A:
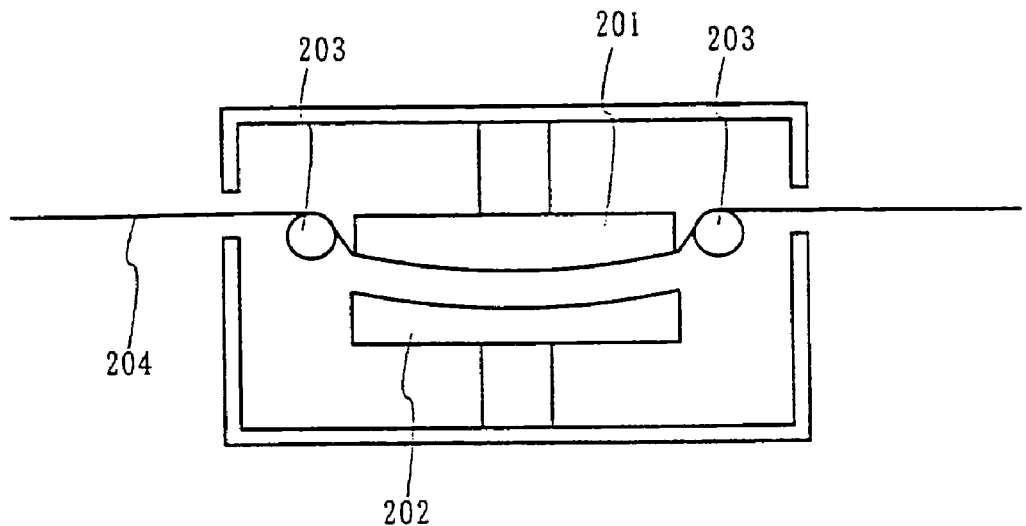
FIGS. 2A and 2B show flexible substrates in a conventional curved surface electrode method film formation apparatus.
Figure 2B:
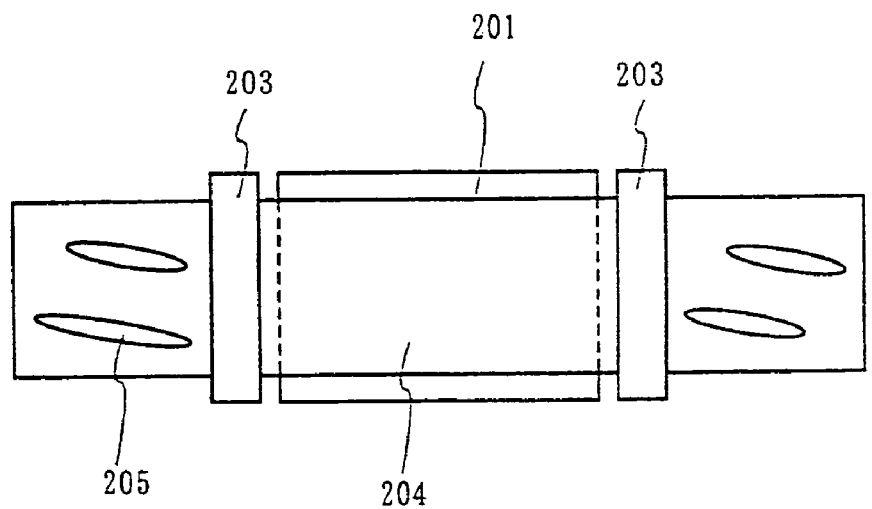
Figure 3:
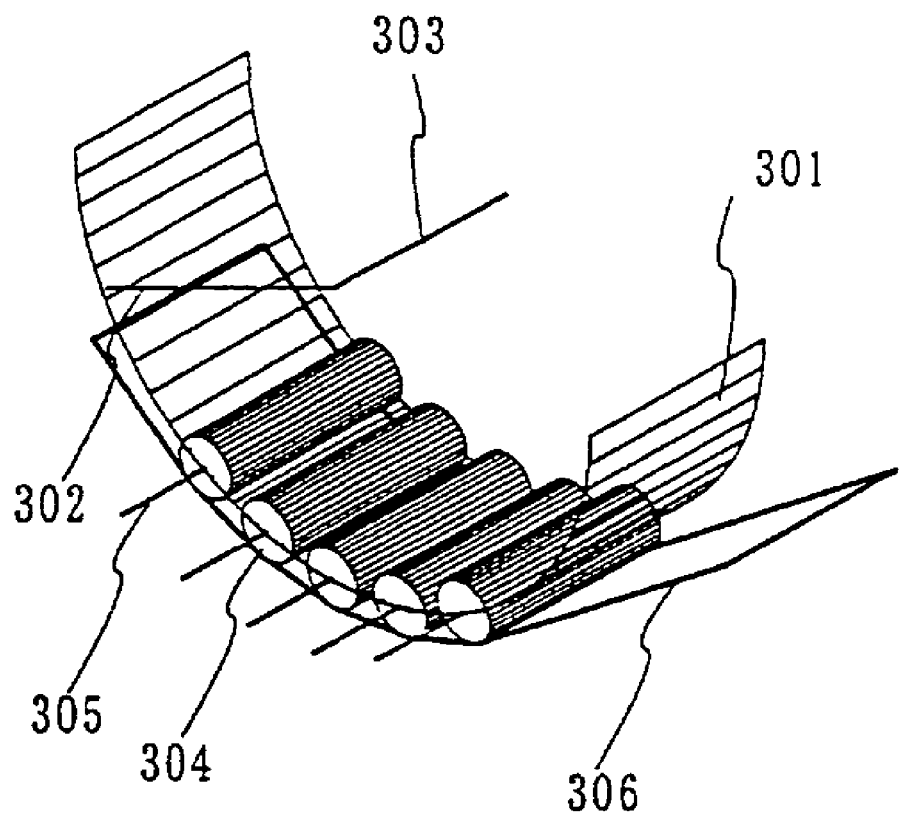
FIG. 3 shows an aspect of cylindrical rollers of a curved surface roller method of the present invention.
Figure 4A:
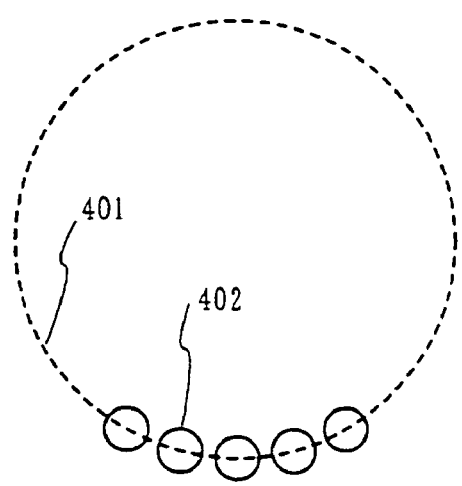
FIGS. 4A to 4C show arrangements of curved surface roller method cylindrical rollers of the present invention.
Figure 4B:
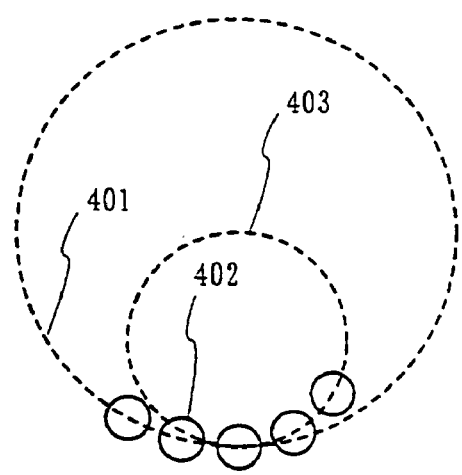
Figure 4C:
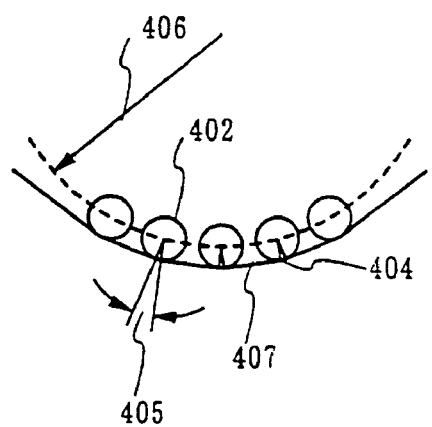
Figures 5A, 5B:
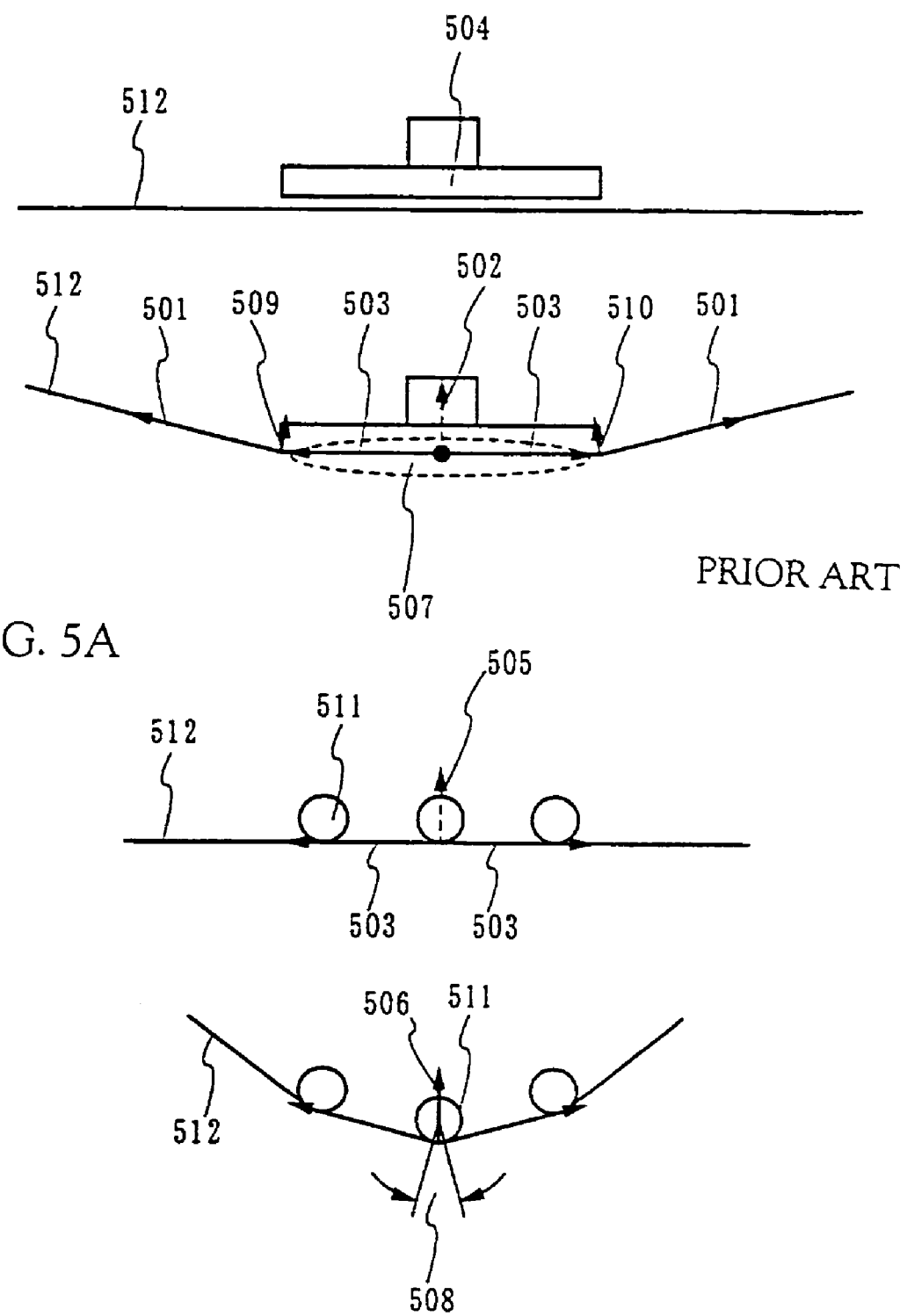
FIGS. 5A and 5B dynamically illustrate tensile forces working on flexible substrates of a conventional parallel plate method and a curved surface roller method of the present invention, respectively.
Figure 6A:
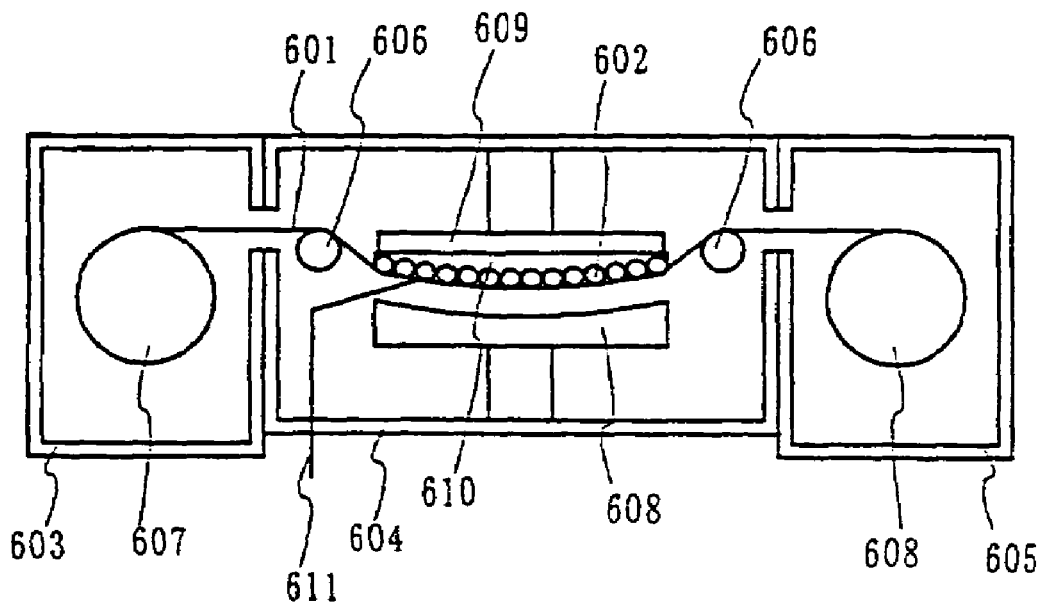
FIGS. 6A and 6B show curved surface roller method film formation apparatuses of the present invention.
Figure 6B:
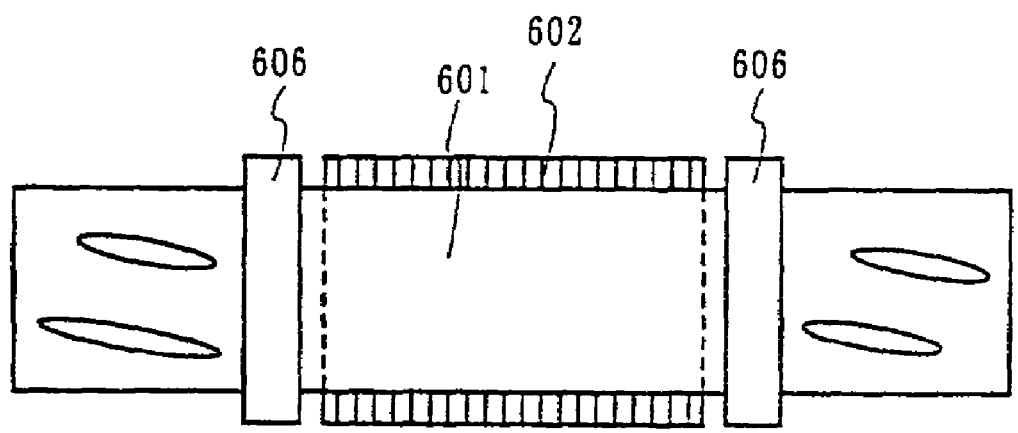
Figure 7A:
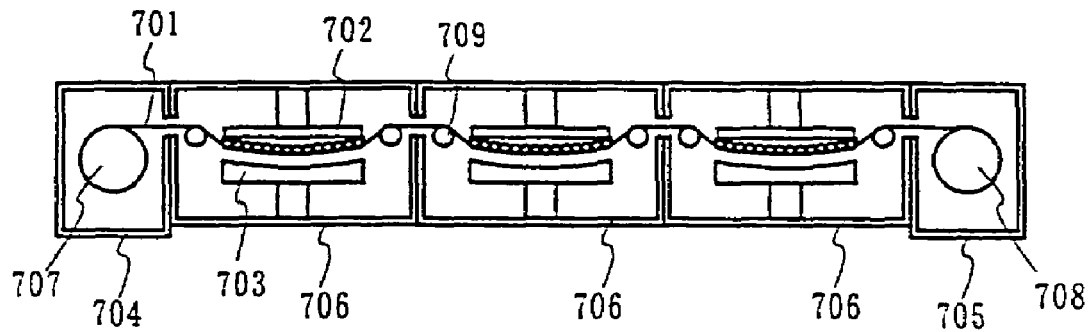
FIGS. 7A and 7B are diagrams for comparing the size of a curved surface roller method film formation apparatus of the present invention and a cylindrical can method film formation apparatus.
Figure 7B:
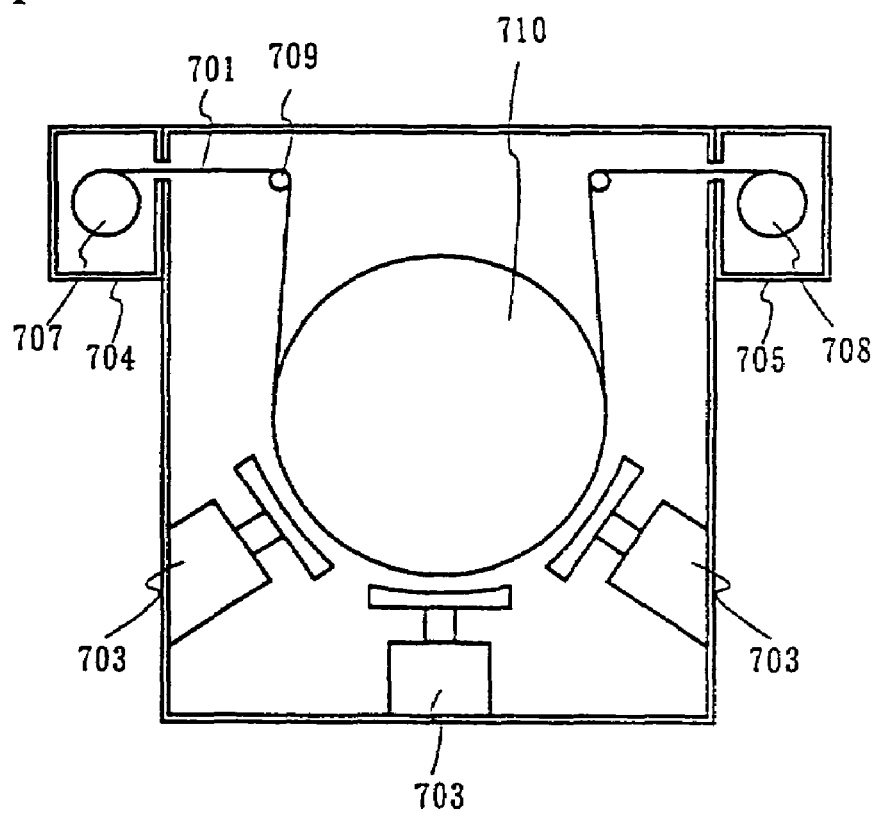

A film formation apparatus having a conveyor device like that shown in FIGS. 6A and 6B is prepared. This film formation apparatus is provided with a conveyor device for a flexible substrate, a vacuum chamber, a film formation gas introduction system, an evacuation system, and a high frequency power supply introduction system which can generate an energy such as an electromagnetic wave, and film formation is performed by plasma CVD. First, a conveyance supporting portion 610 of the curved surface roller method conveyor device is attached to a heater 609, forming the curved surface roller method conveyor device. The conveyance supporting portion of the curved surface roller method conveyor device is used as a ground electrode. The high frequency power supply introduction system is composed of the curved surface roller method ground electrode and a high frequency power supply side electrode 608. Next, a flexible substrate 601 is set so as to be rolled out from a roll-out roll 607, to pass through a guide roll 606 and the curved surface roller method ground electrode 610, and to be rolled up by a roll-up roll 608. At this point, a constant rotational torque is applied to the roll-out roll 607 in the opposite direction with respect to the roll-up roll 608, and therefore a tensile force is applied to the flexible substrate 601, which comes into close contact with the curved surface of the curved surface roller method ground electrode.

In order to measure temperature changes in the surface of the flexible substrate 601, a thermocouple 611 is fixed in a certain position of the surface of the flexible substrate, and the flexible substrate 601 is rolled up onto the roll-up roll 608 and conveyed. At this point the portion of the flexible substrate to which the thermocouple is fixed records the temperature changes every 1 second near a portion contacting the curved surface roller method ground electrode 610. Measured values are shown in FIG. 9A. The measurement results are shown in difference from the average substrate temperature when the flexible substrate is in contact with the curved surface roller method ground electrode. In conclusion, the substrate temperature is nearly constant when the substrate is in contact with the curved surface roller method electrode, and the degree of irregularity in the temperature is not so serious as to cause a problem. Strictly speaking, a temperature difference exists between the heat transfer portion 801 at which the flexible substrate and the cylindrical roller shown in FIG. 8 are in contact with each other, and the heat transfer portion 802 where heat is radiated from the cylindrical roller and from the roller block, but this temperature difference is less than 1° C. For comparison, data at a time when a flexible substrate passes through a plate ground electrode portion having a built-in heater for a parallel plate method film formation apparatus having a conveyor device is shown in FIG. 9B. A 2 mm gap is formed between the flexible substrate and the plate ground electrode having the built-in heater, so that the substrate is not in contact with the electrode and therefore heat transfer to the substrate when the flexible substrate passes through is always by radiation. Comparing with this data, it can be seen that temperature unevennesses due to the curved surface roller method electrode are suppressed and do not cause a problem.

Wrinkles in the flexible substrate, and film formation unevennesses caused by the wrinkles, were evaluated. First, a PEN (polyethylene naphthalate) film was used in a flexible substrate, and the substrate was set into the conveying system of the film formation apparatus having the conveyor device shown in FIGS. 6A and 6B. Then a tensile force was applied to the flexible substrate. The flexible substrate 601 was observed from a lower portion of the curved surface roller method ground electrode, and no wrinkles were seen in the substrate. Next, silane gas and hydrogen gas were introduced into a film formation chamber 604, and an electric discharge was generated between the high frequency power supply side electrode 608 and the curved surface roller method ground electrode 610, performing film formation of non-single crystal silicon on the flexible substrate. Non-single crystal silicon denotes amorphous silicon, microcrystalline silicon, and thin film polycrystalline silicon. The film thickness of this film was measured using a spectrophotometer and scanning in the width direction of the substrate. Results are shown in FIGS. 10A and 10B. FIG. 10A shows a film thickness distribution in the substrate width direction of a film formed by using a parallel plate method film formation apparatus, and FIG. 10B shows a film thickness distribution of a film formed by using the curved surface roller method film formation apparatus. There were wrinkles in the substrate during film formation with the parallel plate method film formation apparatus, and therefore the film thickness distribution was on the order of ±10% and color unevennesses could be observed even with the naked eye. There were no wrinkles in the substrate during film formation with the curved surface roller method film formation apparatus, the film thickness distribution could be suppressed to approximately ±5%, and almost no color unevennesses could be verified by observing with the naked eye. As a result, it can be said that film thickness unevennesses can be suppressed.

As has been described, the present invention is a curved surface roller method conveyor device of about the same size as a conventional parallel plate method conveyor device, and a film formation apparatus having the conveyor device. The present invention thus can provide the conveyor device and a film formation apparatus having the conveyor device which are more successful in reducing size than a film formation apparatus having a conventional cylindrical can method conveyor device, and which can continuously convey a flexible substrate while preventing wrinkles in the flexible substrate and while preventing damage to the back surface of the flexible substrate.

What is claimed is:

1. A method for manufacturing a semiconductor device comprising:
   providing a first roller, a second roller, and a plurality of cylindrical rollers arranged along an arc with a radius R between the first roller and the second roller in a chamber wherein center axes of the plurality of cylindrical rollers run parallel to each other;
   providing an electrode opposed to the plurality of cylindrical rollers in the chamber;
   moving a flexible substrate from the first roller to the second roller wherein the flexible substrate passes through a space between the plurality of cylindrical rollers and the electrode;
   introducing a gas into the chamber;
   applying an electrical energy to the electrode to form a plasma of the gas; and
   forming a film over the flexible substrate by using the plasma,
   wherein the flexible substrate is curved so that the flexible substrate has a concave surface being in contact with consecutive ones of the plurality of cylindrical rollers and a convex surface opposite to the concave surface.

2. The method according to claim 1, wherein a solar battery includes the film.

3. A method for manufacturing a semiconductor device comprising:
   providing a first conveyance supporting portion including a plurality of cylindrical rollers arranged along an arc with a radius R in a first chamber wherein center axes of the plurality of cylindrical rollers run parallel to each other;
   providing a first electrode opposed to the first conveyance supporting portion in the first chamber;
   providing a second conveyance supporting portion including a plurality of cylindrical rollers arranged along an arc with a radius R in a second chamber wherein center axes of the plurality of cylindrical rollers run parallel to each other;
   providing a second electrode opposed to the second conveyance supporting portion in the second chamber;
   moving a flexible substrate from the plurality of cylindrical rollers of the first conveyance supporting portion to the plurality of cylindrical rollers of the second conveyance supporting portion wherein the flexible substrate passes through a space between the first conveyance supporting portion and the first electrode and a space between the second conveyance supporting portion and the second electrode;
   introducing a gas into the first chamber;
   applying an electrical energy to the first electrode to form a plasma of the gas;
   forming a first film over the flexible substrate by using the plasma in the first chamber;
   introducing a gas into the second chamber;
   applying an electrical energy to the second electrode to form a plasma of the gas; and
   forming a second film over the flexible substrate by using the plasma in the second chamber,
   wherein the flexible substrate is curved so that the flexible substrate has a concave surface being in contact with consecutive ones of the plurality of cylindrical rollers and a convex surface opposite to the concave surface in the first and second chambers.

4. The method according to claim 3, wherein a solar battery includes the first film and the second film.

5. A method for manufacturing a semiconductor device comprising:

providing a first roller, a second roller, and a plurality of cylindrical rollers arranged along an arc with a radius R between the first roller and the second roller in a chamber wherein center axes of the plurality of cylindrical rollers run parallel to each other;

providing an electrode opposed to the plurality of cylindrical rollers in the chamber;

moving a flexible substrate from the first roller to the second roller wherein the flexible substrate passes through a space between the plurality of cylindrical rollers and the electrode and wherein the plurality of cylindrical rollers and the flexible substrate are heated;

introducing a gas into the chamber;

applying an electrical energy to the electrode to form a plasma of the gas; and forming a film over the flexible substrate by using the plasma, wherein the flexible substrate is curved so that the flexible substrate has a concave surface being in contact with consecutive ones of the plurality of cylindrical rollers and a convex surface opposite to the concave surface.

6. The method according to claim 5, wherein a solar battery includes the film.

7. A method for manufacturing a semiconductor device comprising:

providing a first conveyance supporting portion including a plurality of cylindrical rollers arranged along an arc with a radius R in a first chamber wherein center axes of the plurality of cylindrical rollers run parallel to each other;

providing a first electrode opposed to the first conveyance supporting portion in the first chamber;

providing a second conveyance supporting portion including a plurality of cylindrical rollers arranged along an arc with a radius R in a second chamber wherein center axes of the plurality of cylindrical rollers run parallel to each other;

providing a second electrode opposed to the second conveyance supporting portion in the second chamber;

moving a flexible substrate from the plurality of cylindrical rollers of the first conveyance supporting portion to the plurality of cylindrical rollers of the second conveyance supporting portion wherein the flexible substrate passes through a space between the first conveyance supporting portion and the first electrode and a space between the second conveyance supporting portion and the second electrode and wherein the plurality of cylindrical rollers of the first conveyance supporting portion, the plurality of cylindrical rollers of the second conveyance supporting portion and the flexible substrate are heated;

introducing a gas into the first chamber;

applying an electrical energy to the first electrode to form a plasma of the gas;

forming a first film over the flexible substrate by using the plasma in the first chamber;

introducing a gas into the second chamber;

applying an electrical energy to the second electrode to form a plasma of the gas; and forming a second film over the flexible substrate by using the plasma in the second chamber, wherein the flexible substrate is curved so that the flexible substrate has a concave surface being in contact with consecutive ones of the plurality of cylindrical rollers and a convex surface opposite to the concave surface in the first and second chambers.

8. The method according to claim 7, wherein a solar battery includes the first film and the second film.

* * * * *